US009726922B1

(12) United States Patent
Agarwal et al.

(10) Patent No.: US 9,726,922 B1
(45) Date of Patent: Aug. 8, 2017

(54) REDUCING DISPLAY NOISE IN AN ELECTRONIC DEVICE

(71) Applicant: Apple Inc., Cupertino, CA (US)

(72) Inventors: Manu Agarwal, Palo Alto, CA (US); Erno H. Klaassen, Los Altos, CA (US); Hopil Bae, Sunnyvale, CA (US); Kingsuk Brahma, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 392 days.

(21) Appl. No.: 14/137,705

(22) Filed: Dec. 20, 2013

(51) Int. Cl.
G02F 1/1347 (2006.01)
G02F 1/1333 (2006.01)
G01R 31/00 (2006.01)
G02B 5/20 (2006.01)
G02F 1/133 (2006.01)

(52) U.S. Cl.
CPC ....... G02F 1/13338 (2013.01); G01R 31/001 (2013.01); G02B 5/201 (2013.01); G02F 1/13306 (2013.01)

(58) Field of Classification Search
CPC ............... G02F 1/13471; G02F 1/1347; G02F 2001/133342; G02F 1/13338; G02F 1/13306; G09G 3/2011; G01R 31/001; G02B 5/201; G06F 3/044; G06F 3/045
USPC ..................................... 349/74; 345/173–178
See application file for complete search history.

(56) References Cited

U.S. PATENT DOCUMENTS

| 5,142,912 | A | 9/1992 | Frische |
| 5,345,807 | A | 9/1994 | Butts et al. |
| 5,905,430 | A | 5/1999 | Yoshino |
| 6,069,417 | A | 5/2000 | Yuan |
| 6,130,517 | A | 10/2000 | Yuan |
| 6,788,050 | B2 | 9/2004 | Gotkis |
| 6,998,545 | B2 | 2/2006 | Harkcom et al. |
| 7,046,496 | B2 | 5/2006 | Hsin |
| 7,084,933 | B2 | 8/2006 | Oh et al. |
| 7,463,987 | B2 | 12/2008 | Cech et al. |
| 7,536,918 | B2 | 5/2009 | Rankin et al. |
| 7,543,501 | B2 | 6/2009 | Cottles et al. |
| 7,683,634 | B2 | 3/2010 | Hoen |

(Continued)

FOREIGN PATENT DOCUMENTS

| CN | 1496549 | 5/2004 |
| CN | 102236463 | 11/2011 |

(Continued)

OTHER PUBLICATIONS

Bau, et al., "TeslaTouch: Electrovibration for Touch Surfaces," UIST'10, Oct. 3-6, 2010, New York, New York USA, 10 pages.

(Continued)

*Primary Examiner* — Nathanael R Briggs
*Assistant Examiner* — William Peterson
(74) *Attorney, Agent, or Firm* — Brownstein Hyatt Farber Schreck, LLP

(57) ABSTRACT

A sensing device can be included in a display of an electronic device. Various techniques can be used to reduce display noise in the signals output from the sensing device. The techniques include the use of a filtering layer in a display stack, the use of a non-uniform sampling scheme, averaging together noise signal samples sampled over multiple display frames, and inverting a phase of the sampling of the noise signal over multiple display frames.

20 Claims, 12 Drawing Sheets

(56) References Cited

U.S. PATENT DOCUMENTS

| | | |
|---|---|---|
| 7,688,308 B2 | 3/2010 | Inokuchi |
| 7,825,903 B2 | 11/2010 | Anastas et al. |
| 8,290,602 B2 | 10/2012 | Begey et al. |
| 8,436,809 B2 | 5/2013 | Sohn et al. |
| 8,547,114 B2 | 10/2013 | Kremin |
| 8,547,118 B1 | 10/2013 | Vojjala |
| 8,547,350 B2 | 10/2013 | Anglin et al. |
| 8,599,165 B2 | 12/2013 | Westhues et al. |
| 8,622,923 B2 | 1/2014 | Pons et al. |
| 8,669,960 B2 | 3/2014 | Murphy et al. |
| 8,760,248 B2 | 6/2014 | Marie |
| 8,917,198 B2 | 12/2014 | Pagnanelli |
| 9,000,967 B2 | 4/2015 | Pagnanelli |
| 9,052,250 B1 | 6/2015 | Parker et al. |
| 9,063,627 B2 | 6/2015 | Yairi et al. |
| 9,105,255 B2 | 8/2015 | Brown et al. |
| 9,274,660 B2 | 3/2016 | Bernstein et al. |
| 9,310,950 B2 | 4/2016 | Takano et al. |
| 9,373,993 B2 | 6/2016 | Irwin |
| 9,389,727 B2 | 7/2016 | Woolley |
| 9,483,146 B2 | 11/2016 | Davidson et al. |
| 2004/0100007 A1 | 5/2004 | Engwall et al. |
| 2006/0256075 A1 | 11/2006 | Anastas et al. |
| 2008/0011091 A1 | 1/2008 | Weldon |
| 2008/0289887 A1 | 11/2008 | Flint et al. |
| 2009/0028321 A1 | 1/2009 | Cheng |
| 2010/0005851 A1 | 1/2010 | Cottles et al. |
| 2010/0123686 A1 | 5/2010 | Klinghult et al. |
| 2010/0309146 A1 | 12/2010 | Lee et al. |
| 2011/0227872 A1 | 9/2011 | Huska et al. |
| 2012/0038577 A1 | 2/2012 | Brown et al. |
| 2012/0319827 A1 | 12/2012 | Pance et al. |
| 2013/0127756 A1 | 5/2013 | Wang et al. |
| 2013/0154949 A1* | 6/2013 | Jamshidi Roudbari . G06F 3/041 345/173 |
| 2013/0300705 A1* | 11/2013 | Goo .................... G02F 1/13338 345/174 |
| 2014/0142395 A1 | 5/2014 | Sattler et al. |
| 2014/0176485 A1 | 6/2014 | Holmberg et al. |
| 2014/0298884 A1 | 10/2014 | Mindlin et al. |
| 2015/0103961 A1 | 4/2015 | Malipatil et al. |
| 2015/0371608 A1 | 12/2015 | Yamaguchi et al. |
| 2016/0179200 A1 | 6/2016 | Billington et al. |
| 2016/0179243 A1 | 6/2016 | Schwartz |
| 2016/0216833 A1 | 7/2016 | Butler et al. |
| 2016/0259411 A1 | 9/2016 | Yoneoka et al. |
| 2016/0259465 A1 | 9/2016 | Agarwal et al. |
| 2017/0017346 A1 | 1/2017 | Gowreesunker et al. |
| 2017/0052622 A1 | 2/2017 | Smith |
| 2017/0090667 A1 | 3/2017 | Abdollahian et al. |

FOREIGN PATENT DOCUMENTS

| | | |
|---|---|---|
| CN | 102713805 | 10/2012 |
| CN | 103097990 | 5/2013 |
| EP | 0178590 | 8/1986 |
| EP | 1455264 | 8/2004 |
| WO | WO 2010/055195 | 5/2010 |
| WO | WO 2013/170099 | 11/2013 |
| WO | WO 2013/188307 | 12/2013 |
| WO | WO 2014/101943 | 7/2014 |

OTHER PUBLICATIONS

Feist, "Samsung snags patent for new pressure sensitive touch-screens," posted on AndroidAuthority.com at URL: http://www.androidauthority.com/samsung-patent-pressure-sensitive-touch-screens-354860, Mar. 7, 2014, 1 page.

* cited by examiner

| | Frame 1 | Frame 2 | Frame 3 | Frame 4 | |
|---|---|---|---|---|---|
| 1700 → | + | + | − | − | ← 1702 |
| 1704 → | K(Vp+Vn) | −K(Vp+Vn) | −K(Vp+Vn) | K(Vp+Vn) | |
| | A(Vp−Vn) | A(Vp−Vn) | −A(Vp−Vn) | −A(Vp−Vn) | |

REDUCING DISPLAY NOISE IN AN ELECTRONIC DEVICE

TECHNICAL FIELD

The present invention relates generally to electronic devices, and more specifically to electronic devices that perform multiple functions in a display area of the electronic device.

BACKGROUND

Electronic devices such as smart telephones and tablet computing devices typically include a display that allows a user to view images and to interact with various components and applications running on, or connected to, the electronic device. For example, a display can include a multi-touch touchscreen that the user touches to select or interact with an object or application displayed on the display. From the perspective of the user, the display displays the object simultaneously with a touch sensing device detecting one or more touch events on the display. However, the circuitry associated with the display and the circuitry associated with the touch sensing device may or may not operate concurrently due to signal interference and noise issues that can occur when the two functions operate at the same time.

As the number of functions that use or share the display area increase, issues such as noise can also increase and interfere with the operation of at least one function. For example, a force sensing device can use the top surface of the display as an input region. In some situations, the noise produced by one function, such as the display, can overwhelm the signals produced during another operation, such as a force sensing operation. Some of the signals of the display can inject noise into the force sensing signals. The magnitude of the display signals can be much greater than the magnitude of the force sensing signals, making it difficult to discern the force sensing signals from the noise.

SUMMARY

In one aspect, a display stack in an electronic device can include a display layer and two filters, a first filter and a second filter. The first and second filters each reduces display noise produced by the display layer. A polarizer can be disposed below the display layer. As one example, the first filter can include a conductive layer disposed below the polarizer and the second filter a filtering layer disposed between the display layer and the polarizer. As another example, the first filter can include a conductive layer disposed below the polarizer and the second filter one or more VCOM buffers operatively connected to the display layer.

In another aspect, a method of non-uniform sampling of a noise signal can mitigate the display noise in signals received from a sensing device. The method can include sampling a signal produced by the sensing device for a first time period. The signal produced by the sensing device includes noise that is produced by the display and the sampled noise has a first polarity. The sampled noise can be sampled in a positive phase (one polarity) or in a negative phase (opposite polarity) of the noise signal. When the noise is sampled for the first time period, a polarity of the noise produced by the display is switched to an opposite second polarity. The signal produced by the sensing device can then be sampled for a second time period such that noise samples having the opposite second polarity substantially cancel the noise samples having the first polarity.

In yet another aspect, a method for reducing display noise in sense signals produced by a sensing device can include sampling a display noise signal and averaging the display noise samples for a first display frame refresh period, inverting a phase of the sampling, and after inverting the phase, sampling the display noise signal and averaging the display noise samples for a second display frame refresh period. The display noise samples from the first and second display frame refresh periods can be averaged together.

In another aspect, a method for reducing display noise in sense signals produced by a sensing device can include sampling a display noise signal and averaging the display noise samples for a first display frame refresh period, inverting a phase of the sampling, sampling the display noise signal and averaging the display noise samples for a second display frame refresh period, inverting the phase of the sampling, sampling the display noise signal and averaging the display noise samples for a third display frame refresh period, inverting the phase of the sampling, and sampling the display noise signal and averaging the display noise samples for a fourth display frame refresh period. The display noise samples from the first, second, third, and fourth display frame refresh periods can then be averaged together.

BRIEF DESCRIPTION OF THE DRAWINGS

Embodiments are better understood with reference to the following drawings. The elements of the drawings are not necessarily to scale relative to each other. Identical reference numerals have been used, where possible, to designate identical features that are common to the figures.

DETAILED DESCRIPTION

Embodiments described herein provide an electronic device that includes a display and multiple devices that each use or share at least a portion of the display area. By way of example only, the multiple devices can include a touch sensing device and a force sensing device. The touch and force sensing devices can each use at least a portion of the top surface of the display screen as an input region.

In some embodiments, display noise can be injected into the force signals produced by the force sensing device. Various techniques are disclosed herein that reduce or cancel the display noise in the force signals. The techniques include the use of an additional conductive layer in a display stack, the use of a non-uniform sampling scheme, averaging together noise signal samples sampled over multiple display frames, and inverting a phase of the sampling of the noise signal over multiple display frames.

Directional terminology, such as "top", "bottom", "front", "back", "leading", "trailing", etc., is used with reference to the orientation of the Figure(s) being described. Because components of embodiments described herein can be positioned in a number of different orientations, the directional terminology is used for purposes of illustration only and is in no way limiting. When used in conjunction with layers of a display or device, the directional terminology is intended to be construed broadly, and therefore should not be interpreted to preclude the presence of one or more intervening layers or other intervening features or elements. Thus, a given layer that is described as being formed, positioned, disposed on or over another layer, or that is described as being formed, positioned, disposed below or under another layer may be separated from the latter layer by one or more additional layers or elements.

Figure 1:
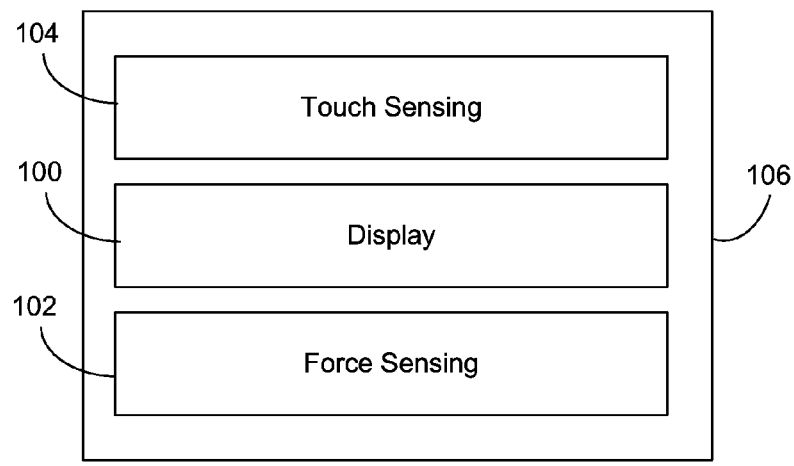
FIG. 1 is a conceptual view of a display screen that can be used to perform multiple functions.

Referring now to FIG. 1, there is shown a conceptual view of a display that can be used to perform multiple functions. The functions can include a display function 100, a touch sensing function 104, and a force sensing function 102. These functions can be performed in conjunction with the display 106. In other words, a user can interact with an image displayed on the display 106 with one or more touches, an applied force, or both touch and force. For example, a game that is displayed on the display 106 can receive touch inputs from a user. As another example, an application displayed on the display 106 can perform one function at one rate of speed when a user applies a small amount of force to the display and perform the function at a faster rate of speed when the user applies a greater amount of force to the display 106.

The touch sensing and force sensing functions can each use or share some or all of the display area. For example, in one embodiment, a user can interact with a displayed image by touching and/or by applying a force at an appropriate position on the display, with the appropriate position located anywhere on the display. In another embodiment, the display function 100 and the touch sensing function 104 can use the entire display 106 while the force sensing function 102 involves a portion of the display 106. Thus, each function can use some or all of the display 106 when in operation. The arrangement of the functions in FIG. 1 is for illustrative purposes only, and does not correspond to any layers or devices in the display or in an electronic device. Additionally, the arrangement of the functions does not correspond to the amount of area on the display used by each function.

Figure 2:
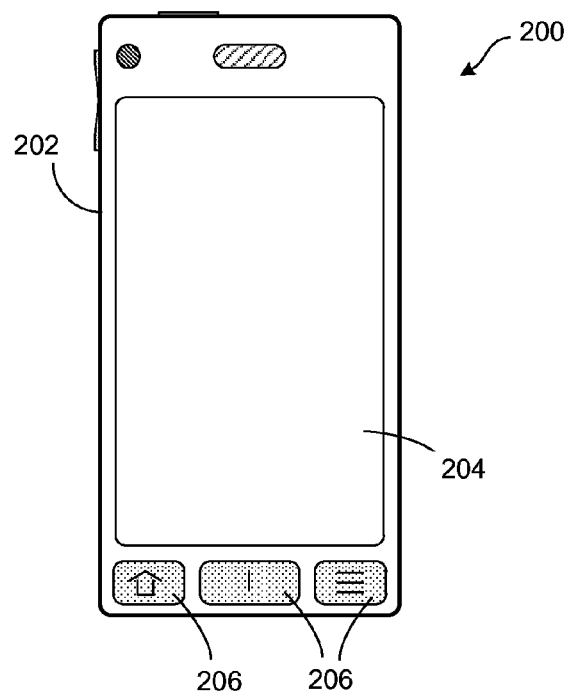
FIG. 2 depicts one example of an electronic device that can be configured to perform multiple functions with respect to a display.

FIG. 2 depicts one example of an electronic device that can be configured to perform multiple functions with respect to a display. In the illustrated embodiment, the electronic device 200 is implemented as a smart telephone. Other embodiments can implement the electronic device differently, such as, for example, as a laptop computer, a tablet computing device, a wearable computing device such as a watch or a head-mounted display device, a digital music player, a display input device, a kiosk, a remote control device, television, and other types of electronic devices that include a display.

The electronic device 200 includes an enclosure 202 surrounding a display 204 and one or more buttons 206 or input devices. The enclosure 202 can form an outer surface or partial outer surface and protective case for the internal components of the electronic device 200, and may at least partially surround the display 204. The enclosure 202 can be formed of one or more components operably connected together, such as a front piece and a back piece. Alternatively, the enclosure 202 can be formed of a single piece operably connected to the display 204.

The display 204 can be implemented with any suitable display, including, but not limited to, a multi-touch sensing touchscreen device that uses liquid crystal display (LCD) technology, light emitting diode (LED) technology, organic light-emitting display (OLED) technology, or organic electro luminescence (OEL) technology. One of the buttons 206 can take the form of a home button, which may be a mechanical button, a soft button (e.g., a button that does not physically move but still accepts inputs), an icon or image on a display, and so on. Further, in some embodiments, some or all of the buttons 206 can be integrated as part of a cover glass of the electronic device.

Embodiments described herein perform a display operation, a touch sensing operation, and a force sensing operation in a display area or in one or more portions of a display area. The force sensing operation is performed during a display refresh period, while the touch sensing operation may or may not be performed during a display refresh operation. Other embodiments, however, are not limited to these types of sensing operations and devices. Embodiments can include any sensing device that does a periodic or non-uniform sampling of the coupled noise signals produced by the display in close synchronization with the display refresh time. Thus, a sensor using any type of sensing technology that includes a display synchronized scan and sampling scheme can use the present invention. By way of example only, a sensor can employ capacitive sensing technology, resistive sensing technology, piezoelectric or piezoresistive sensing technology, magnetic technology, optical technology, inductive technology, and ultrasonic sensing technology.

In the embodiments described herein, the force sensing device is implemented as a capacitive force sensing device that determines or estimates an amount of force applied to an input region through capacitance changes in one or more capacitive sensing elements.

Also in the embodiments described herein, the touch sensing device is implemented as a capacitive touch sensing device that determines a location of one or more touches applied to an input region through capacitance changes in one or more capacitive sensing elements.

Figure 3:
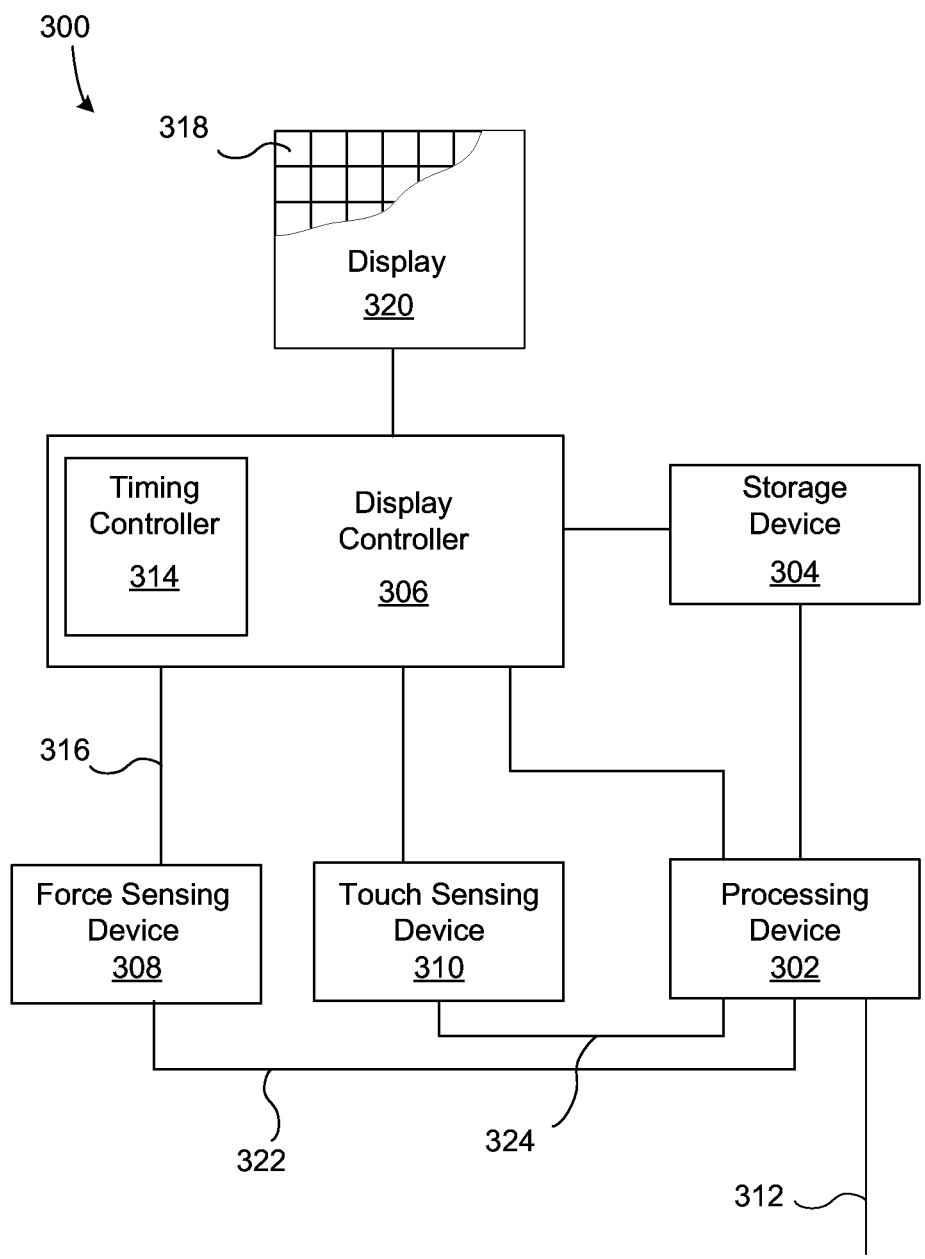
FIG. 3 is a block diagram of a system that includes a display, a force sensing device, and a touch sensing device.

Referring now to FIG. 3, there is shown an example block diagram of a system that includes a display, a force sensing device, and a touch sensing device. A processing device 302 is operably connected to a storage device 304, a display controller 306, a force sensing device 308, and a touch sensing device 310. Image data is received by the processing device 302 on signal line 312 and stored in the storage device 304. The processing device 302 can be implemented with one or more suitable data processing devices, examples of which include a microprocessor, an application-specific integrated circuit (ASIC), and a central processing unit (CPU). The storage device 304 can be configured as one or more memories, including, but not limited to, RAM, ROM, flash memory, and removable memory, or combinations thereof.

The display controller 306 can include a timing controller 314 that generates timing and control signals for the display, the force sensing device, and the touch sensing device. For example, the display controller 306 can transmit one or more excitation signals to the force sensing device on signal line 316. The display controller 306 can be any suitable hardware, software, firmware, or combination thereof adapted to translate the image data into control signals for driving the pixels 318 of the display 320. The display controller can include other suitable components, such as a processing device and/or a storage device.

The processing device 302 receives sense signals from the force sensing device on signal line 322. The processing device 302 determines an amount of force, or a change in force, applied to an input region of the force sensing device based on at least one sense signal. Additionally, the processing device 302 receives the touch signals from the touch sensing device on signal line 324. The processing device 302 determines one or more touch locations on an input region of the touch sensing device based on at least one touch signal.

It should be noted that FIGS. 2 and 3 are illustrative only. In other examples, an electronic device may include different, fewer, or more components than those shown in FIGS. 2 and 3.

Figure 4:
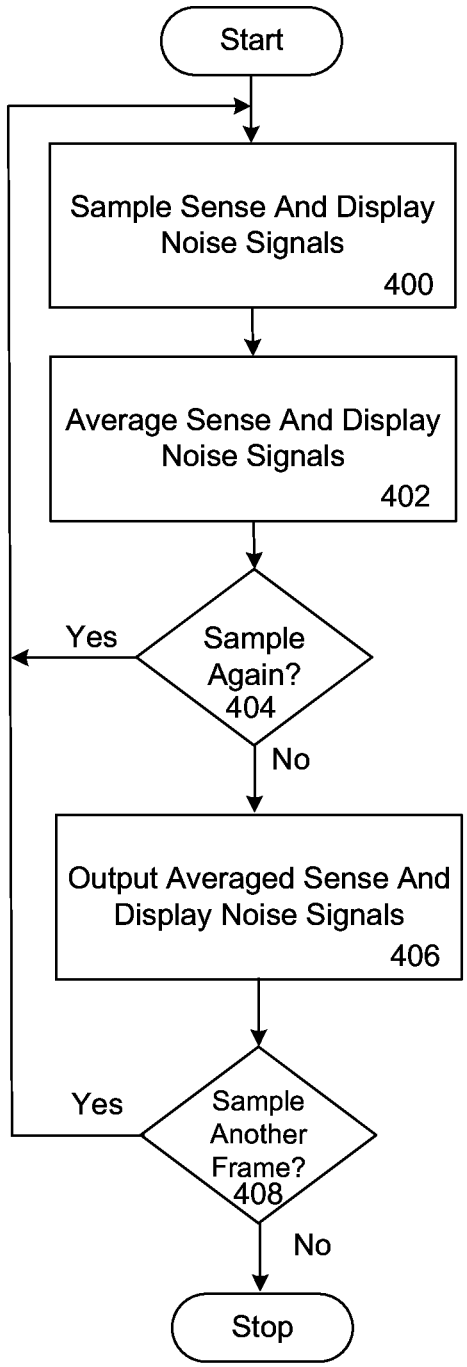
FIG. 4 is a flowchart illustrating one example method for outputting signals from the force sensing device 308 shown in FIG. 3.

FIG. 4 is a flowchart illustrating one example method for outputting signals from the force sensing device 308 shown in FIG. 3. In some embodiments, multiple signals are sampled during a display frame refresh period and averaged together. Initially, a sense signal is sampled in the force sensing device at block 400. Noise signals produced by the display can be coupled to the sense signal and are therefore sampled along with the sense signal. The sampled sense and display noise signal can then be averaged together, as shown in block 402. Next, as shown in block 404, a determination is made as to whether or not another sense and display noise signal is to be sampled. If so, the process returns to block 400 and repeats until another sample will not be taken. In one embodiment, multiple sense and display noise signals are sampled and averaged during each display frame refresh period. Sampling multiple sense and display noise signals can increase the signal-to-noise ratio, and averaging the signals can reduce the effective random noise in the signals.

When the display noise and sense signal will not be sampled again at block 404, the method passes to block 406 where the averaged sense and display noise signal is output from the force sensing device. In some embodiments, the averaged sense and display noise signal is received by a processing device and used to determine an amount of force applied to an input region, or to determine a change in an applied force.

A determination can then be made at block 408 as to whether or not sense and display noise signals are to be sampled during another frame. For example, sense and display noise signals can be sampled during each frame refresh period, periodically, or at select times. If sense and display noise signals are to be sampled, the process returns to block 400. The method ends when sense and display noise signals will not be sampled in another display frame refresh period.

In other embodiments, additional or different blocks can be included in the method shown in FIG. 4. By way of example only, a mathematical operation other than averaging can be performed on the sampled sense and display noise signals at block 402. Additionally or alternatively, one or more blocks can be omitted in some embodiments. For example, block 402 can be omitted in some embodiments. In these embodiments, the sampled sense and display noise signals are sampled but not averaged by the force sensing device. The sampled sense and display noise signals can be received by a processing device, and the processing device can process (e.g., average) the sampled sense and display noise signals.

Figure 5:
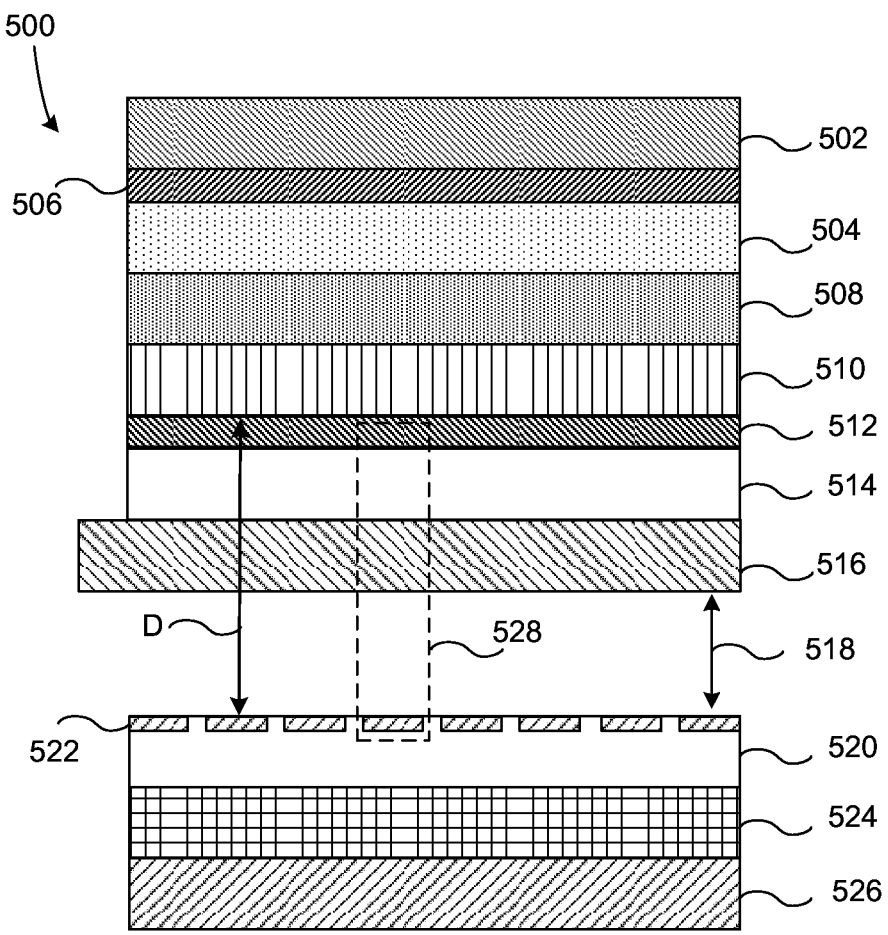
FIG. 5 is a cross-sectional view of a display stack that can be included in the display 204 shown in FIG. 2.

Referring now to FIG. 5, there is shown a cross-sectional view of a display stack that can be included in the display 204 shown in FIG. 2. A top layer in the display stack 500 can be a cover glass 502 that is disposed over a front polarizer 504. The cover glass 502 can be a flexible touchable surface that is made of any suitable material, such as, for example, a glass, a plastic, sapphire, or combinations thereof. The cover glass 502 can act as an input region for a touch sensing device and a force sensing device by receiving touch and force inputs from a user. The user can touch the cover glass 502 with one or more fingers or with another element such as a stylus.

An adhesive layer 506 can be disposed between the cover glass 502 and the front polarizer 504. Any suitable adhesive can be used in adhesive layer, such as, for example, an optically clear adhesive. A color filter layer 508 can be positioned below the front polarizer 504. The color filter layer 508 can provide the colors for a color display. The color filter layer 508 can be implemented in any suitable form and can include a color filter layer that is known and used in the art. By way of example only, a RGB display can include a color filter layer having filter elements that filter red, green, and blue light.

A display layer 510 can be positioned below the color filter layer 508. The display layer 510 may take a variety of forms, including a LCD display, a light-emitting diode (LED) display, and an organic light-emitting diode (OLED) display. In some embodiments, the display layer 510 can be formed from glass or have a glass substrate. Embodiments described herein include a multi-touch touchscreen LCD display layer.

A conductive layer 512 can be positioned between the display layer 510 and a back polarizer 514. The conductive layer can be a solid layer as shown, or the conductive layer can be patterned into discrete electrodes (not shown). The front and back polarizers 504, 514 can be implemented in any suitable form and can include polarizers that are known and used in the art. A back light unit 516 can be positioned below the back polarizer. The back light unit 516 provides a back light for the LCD display layer 510.

A compressible gap 518 can be formed between the back light unit 516 and a sensing layer 520. The compressible gap 518 can include an air gap, a compressible substance, or a compressible structure. The sensing layer 520 can include a set of discrete electrodes 522. In some embodiments, the set of electrodes 522 can be replaced with a solid conductive layer similar to the illustrated conductive layer 512. An adhesive layer 524 can be positioned between the sensing layer 520 and a mid-plate or support structure 526.

A force sensing device can include the conductive layer 512 and the sensing layer 520. The conductive layer 512 and the first set of electrodes 522 can be made of any suitable conductive material, such as a transparent conductive material. A capacitive sensing element 528 can be formed by the conductive layer 512 and each discrete electrode in the first set of electrodes 522. The capacitive sensing elements can operate in a mutual capacitance mode or in a self-capacitance mode. In a mutual capacitance mode, the conductive layer 512 is driven with an excitation signal and the capacitance of each capacitive sensing element is measured. In a self-capacitance mode, the conductive layer 512 is connected to a reference voltage, such as ground and the capacitance of each capacitive sensing element is measured.

A distance D separates the conductive layer 512 from the first set of electrodes 522. When a force is applied to the cover glass 502 (i.e., the input region), the cover glass 502 flexes and the distance D is reduced. The display stack is pushed or otherwise moved downward by the applied force and the capacitance of one or more capacitive sensing elements may increase since the layers are moved closer to one another. This increase in capacitance can be correlated to a decrease in distance between the layers, and thus, to an amount of force needed to move the layers a given distance. Thus, the change in capacitance can be used to determine an amount of force applied to the input region, or to determine a change in an amount of applied force.

Figure 6:
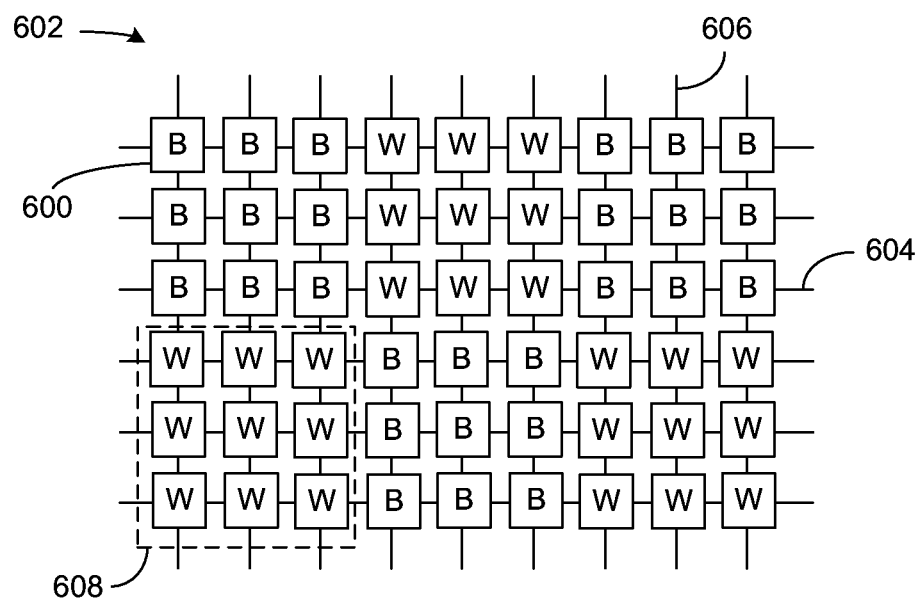
FIG. 6 depicts one example of a black and white checkerboard pattern that can be displayed on a display.

Noise produced by the display layer 510 can couple to the conductive layer 512, which results in the noise being sampled when the capacitances of the capacitive sensing elements are measured. And some visual patterns displayed on a display can introduce a step into the display noise signal. For example, FIG. 6 depicts one example of a black and white checkerboard that can produce a step in the noise charge that is injected into the force sensing device. Although only forty-five pixels are shown, those skilled in the art will recognize a display can include thousands or millions of pixels. The pixels 600 are arranged in a matrix 602. Each row of pixels is connected to a row or gate select line 604 and each column of pixels is connected to a column or drive line 606. To address a particular pixel in the matrix, a charge or voltage is applied to the gate select line associated with the pixel to select the row of pixels. A voltage is also applied to the drive line associated with the pixel. Since all of the other gate select lines that intersect with the activated drive line are turned off, only the desired pixel receives a charge, and the pixel acts as a capacitor to hold the charge until the next refresh cycle.

In the illustrated embodiment, the pixels 600 depict a 3×3 displayed pattern with the pixels in each 3×3 group 608 having the same color. The pixels in adjacent blocks have the opposite color. There can be several issues with the 3×3 checkerboard pattern, as well as any odd sized checkerboard pattern (e.g., 1×1, 5×5). Having an odd number of pixels in a repeating pattern along each gate select line 604 can cause an imbalance in the number of drive lines 606 transitioning to a positive polarity and the number of drive lines transitioning to a negative polarity. This imbalance can produce a "step" in the noise for a column inversion panel. Additionally or alternatively, other inversion scheme panels may have other display patterns that cause similar issues. Additionally, the noise can have an odd periodicity over time when an odd number of pixels are arranged in a repeating pattern along the drive lines 606 due to a spatially repeating visual pattern on the display for part of all of the display. In some embodiments, this periodicity can match the periodicity of the sense signal and a fair amount of noise can accumulate in the sensing signal. This periodicity and accumulation of noise can reduce the benefits of sampling a large number of samples, as described in conjunction with FIG. 4.

Figure 7:
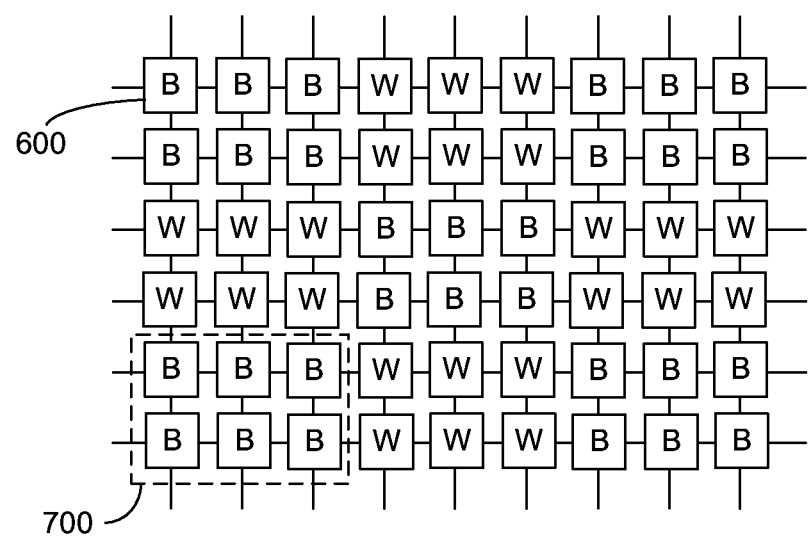
FIG. 7 illustrates another example of a black and white checkerboard pattern that can be displayed on a display.

Referring now to FIG. 7, there is shown one example of a 3×2 pixel checkerboard pattern that can be displayed on a display. Like FIG. 6, only forty-five pixels are shown, but those skilled in the art will recognize a display can include thousands or millions of pixels. The pixels 600 are grouped into 3×2 pixel blocks 700, with the pixels in a respective block having the same color. The pixels in adjacent blocks have the other color.

Like the 3×3 checkerboard pattern, there can be several issues with the 3×2 checkerboard display pattern. As described earlier, having an odd number of pixels in a repeating pattern along the row lines can cause an imbalance in the number of drive lines 606 transitioning to a positive polarity and the number of drive lines transitioning to a negative polarity, which can produce a "step" in the noise charge for a column inversion panel. Other inversion scheme panels may have other display patterns that cause similar noise issues. Additionally, the noise can have an even periodicity over time when an even number of pixels are arranged in a repeating pattern along the column lines. The injected noise charge can produce a non-random periodic noise in the display that may not be mitigated with known averaging type filtering schemes.

Figure 8:
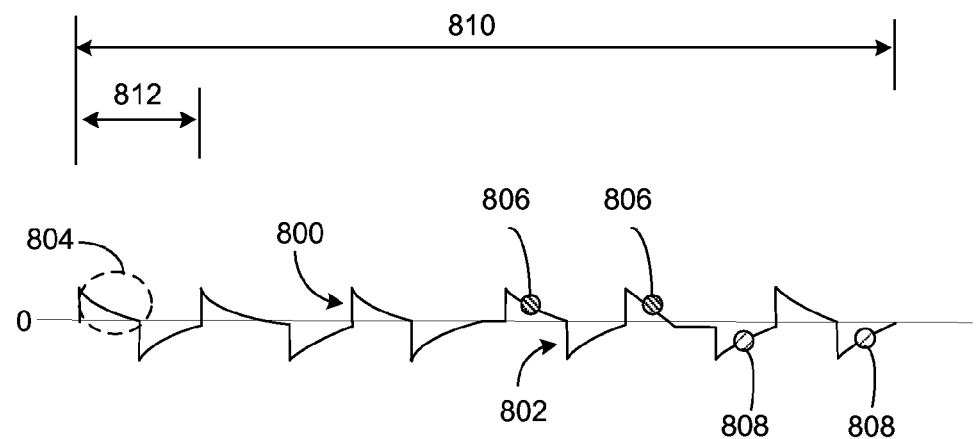
FIG. 8 illustrates a display noise signal that can produced by the display stack 500 shown in FIG. 5.

FIG. 8 illustrates a display noise signal that can be produced by the display stack 500 shown in FIG. 5. In the illustrated embodiment, the entire display noise signal represents the noise signal produced during a display frame refresh period 810. The noise signal produced during the display frame refresh period 810 contains noise that is produced during each display line refresh period 812.

Figure 9:
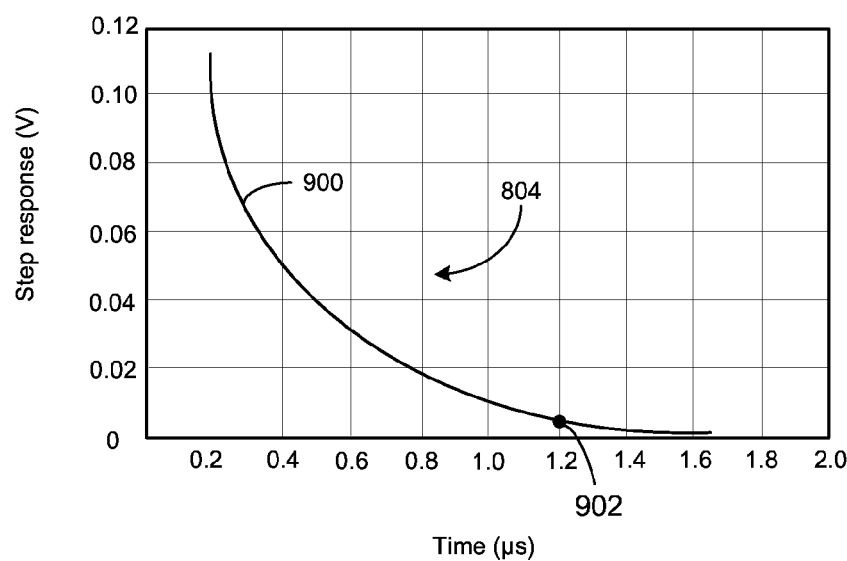
FIG. 9 is an expanded view of the area 804 shown in FIG. 8.

As described earlier, the conductive layer 512 can be a solid layer or patterned into discrete electrodes. The conductive layer 512 is the first electrode (or set of electrodes) for the force sensing device, and the conductive layer produces a first level of high pass filtering. So after passing through the conductive layer 512, the display noise signal represents a first order RC high pass response that is illustrated in FIG. 8. Thus, the conductive layer 512 acts as a filter for the display noise signal. The display noise signal is modeled as having "steps" in both the positive direction 800 and in the negative direction 802. FIG. 9 is an expanded view of the area 804 shown in FIG. 8. The noise signal includes an RC settling 900. The noise signal has a decaying voltage shift and a residual settling error. Thus, in some embodiments, the sampling point 902 is chosen as late in time as possible.

In some embodiments, the injected noise charge may not be mitigated with known averaging type filtering schemes. Several techniques are disclosed herein that can reduce display noise in the signals produced by a sensing device.

Noise Filter and Sampling Point Selection

One technique for reducing display noise in the sense signals of a sensing device (e.g., force sensing device) is to filter the display noise to mitigate or cancel the noise signal. The filter can tune or shape a step response in a display noise signal. Additionally or alternatively, the sampling point of the display noise signal can be selected to minimize display noise when the samples of the force signal in the force sensing device are sampled. For example, in one embodiment, a step response from the display driver circuits can be minimized or cancelled by shaping the step response and/or by selecting an optimum sampling point for the force signals in the force sensing device.

Figure 10:
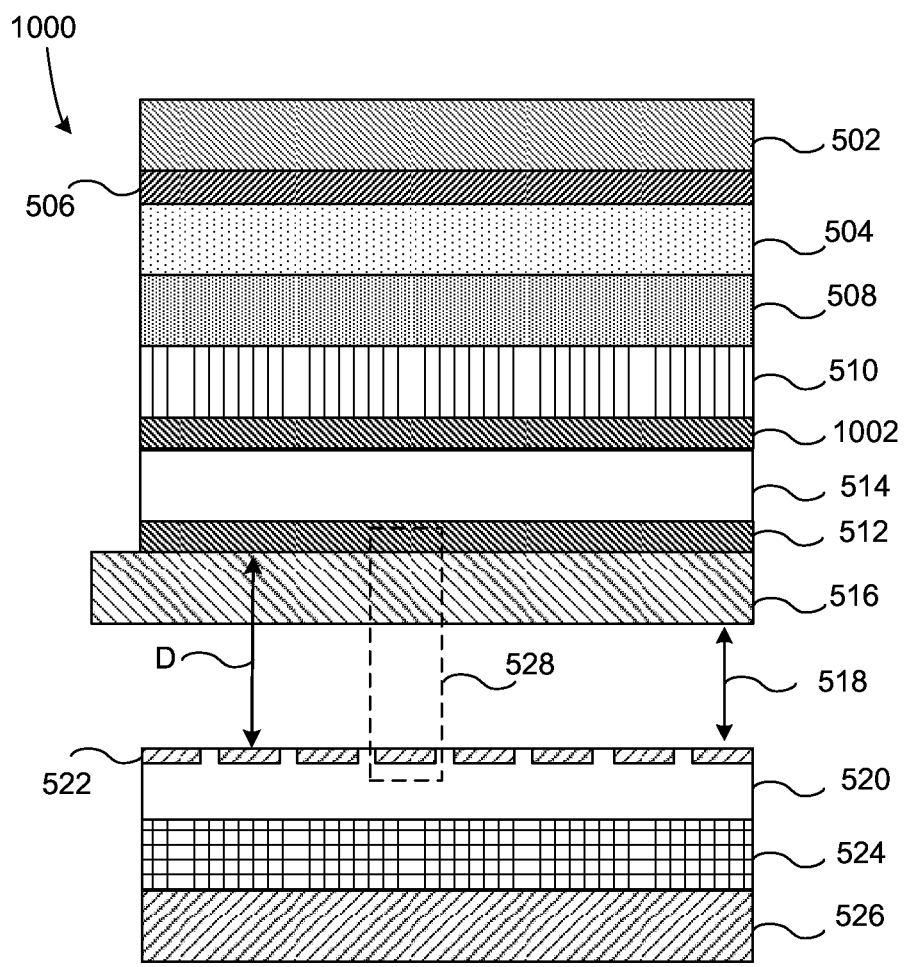
FIG. 10 is a cross-sectional view of another display stack that can be included in the display 204 shown in FIG. 2.

As described previously, the conductive layer 512 can act as a first filter for the display noise. So in one embodiment, a second filter can be constructed with another conductive layer that is included in a display stack. FIG. 10 depicts a display stack that is suitable for use in the display 204 shown in FIG. 2. Note that other embodiments can construct a display differently. For example, other embodiments can omit one or more layers, add one or more layers, or alter the order of one or more layers included in a display stack. The layer or layers in a display can be determined by the display technology included in the display.

The display stack 1000 is similar to the display stack 500 shown in FIG. 5 except for two differences. First, the conductive layer 512 is positioned between the back polarizer 514 and the back light unit 516. Second, a filtering layer 1002 is positioned between the display layer 510 and the back polarizer 514. The filtering layer 1002 can be made of any suitable material, such as a conductive material. As will be described in more detail later, the filtering layer 1002 can act as a second filter that can mitigate the step response of the noise signal shown in FIG. 8.

It should be noted that a the filtering layer 1002 can be positioned at different locations in other embodiments. For example, the conductive layer 512 can be disposed under the back light unit 516 instead of between the back polarizer 514 and the back light unit 516.

Figure 11:
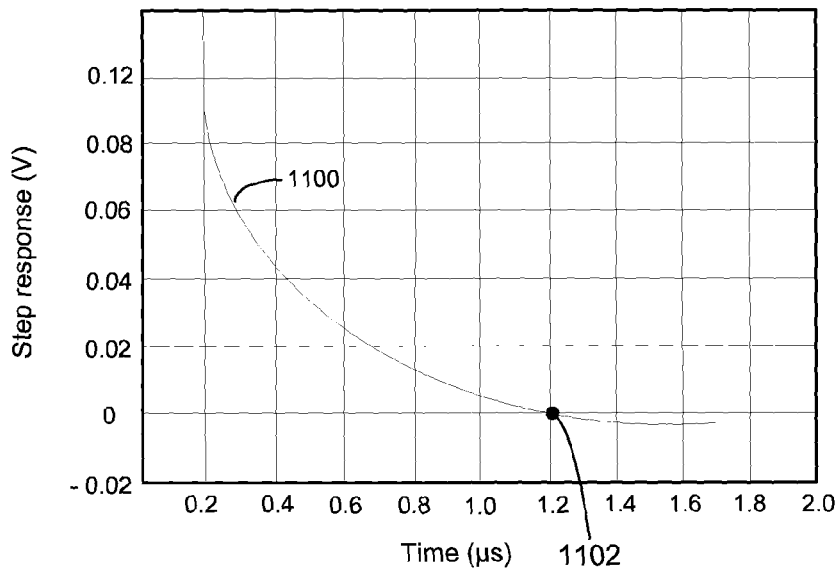
FIG. 11 illustrates an example graph of sample point selection for the display stack 1000 shown in FIG. 10.

Additionally, sampling point optimization can be used to reduce or cancel the step response in the noise signal shown in FIG. 5. FIG. 11 illustrates an example graph of sample point selection for the display stack 1000 shown in FIG. 10. The settling 1100 with an additional filtering layer 1002 can produce a zero crossing in the step response behavior, unlike the settling behavior seen in FIG. 9. This shift creates a region of relatively low noise that approximately equals zero for a given time period. The point at which the decaying negative voltage shift is approximately zero can be chosen as the sampling point 1102.

Other embodiments can filter the display noise differently. For example, in one embodiment, the "filter" for the display noise can be achieved within the display drive and VCOM buffers network. Those skilled in the art will recognize the VCOM plane has certain charging and discharging behaviors due to the construction of the VCOM plane. Any first order RC discharge path on the VCOM plane may make the coupled noise signal look like a first order RC high pass filtered version of a step voltage excitation. Thus, a first order RC discharge path on the VCOM plane can have the same effect on the display noise as the additional conductive layer 1002.

As described earlier, the display layer 510 can act as a noise source and produce the display noise shown in FIG. 8. The VCOM buffer plane is typically included in the display layer 510. Characteristics of the VCOM buffers can be tuned or selected to produce the plot shown in FIG. 11. For example, the RC time constant and/or the drive signal can be controlled such that point 1102 occurs in the settling plot 1100 shown in FIG. 11. The control of one or more characteristics of at least one VCOM buffer can be predetermined or adaptive. For example, the display controller 306 shown in FIG. 3 can adaptively control the drive signal to one or more VCOM buffers to produce a low noise period (e.g., substantially zero) in which the display noise is sampled.

Embodiments that utilize the noise filter include two high pass filters. The first high pass filter is the conductive layer 512 in the display stack 1000 (FIG. 10). The other high pass filter can be the filtering layer 1002 in the display stack 1000, or the second high pass filter can be the VCOM buffers. The second high pass filter creates an additional "zero" point that enables the sense signal to be sampled while the display noise is reduced or at a minimum value.

In one embodiment, the sampling point can be predicted using the following approximate equation:

$$V\text{out} = V_0(\exp(-t/\tau 2) - \tau 2/\tau 1) \qquad \text{Equation 1}$$

where $\tau 1$ is a time constant related to the additional conductive layer 1002 in FIG. 10, and $\tau 2$ is a time constant associated with the set of electrodes 522. For analytical simplicity, it is assumed $\tau 1 \gg \tau 2$. Alternatively, $\tau 2 \gg \tau 1$. The zero cross over point based on equation 1 is given by $tz = \tau 2 \ln(\tau 1/\tau 2)$, where $tz$ represents the time the settling signal crosses the zero point. The gradient of voltage at the zero cross over point is given by $V_0/\tau 1$ and the maximum settling error can be determined by $-V_0 \ast \tau 2/\tau 1$. Both the gradient and $tz$ are optimized in some embodiments.

In other embodiments, it may be assumed $\tau 1 \sim \tau 2$. In these embodiments, in certain ranges the zeroing and optimum sampling point(s) may still occur and can be predicted. And in other embodiments, $\tau 2$ and $\tau 1$ may not be known precisely but a calibration can be performed to determine the optimum sampling point(s).

Non-Uniform Sampling

Another technique for reducing display noise in the sense signals of a force sensing device is to change the sampling scheme in various non-uniform configurations to mitigate or cancel the noise signal. Essentially, the number of positive display noise signal samples substantially equal the number of negative display noise signal samples in a display frame refresh period or over two or more display frame refresh periods.

Figure 12:
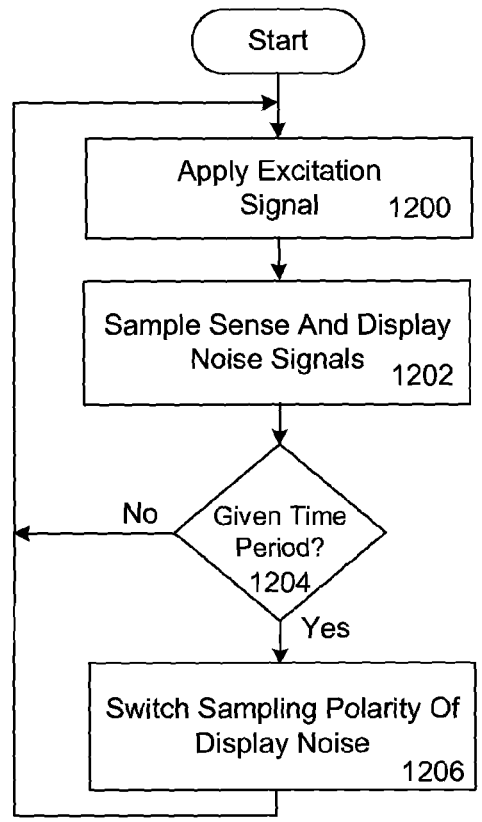
FIG. 12 is a flowchart of a method for non-uniform sampling to mitigate display noise.

Referring now to FIG. 12, there is shown a flowchart of a method for non-uniform sampling to mitigate display noise. Initially, an excitation signal is applied to the force sensing device at block 1200. Sense and display noise signals are then sampled and received at block 1202. Next, as shown in block 1204, a determination is made as to whether or not the sense and display noise signals have been sampled for a given period of time. Alternatively, the determination can be whether a given number of samples have been sampled. If the signals have not been sampled for the given period of time, the process returns to block 1200 and repeats until the time period is reached. When the samples have been sampled for the given time period, the method continues at block 1206 where the sampling polarity of the display noise is reversed compared to the sampling polarity in previous noise samples. For example, if the display noise signals were previously positive samples (see positive phase samples 806 in FIG. 8), the sampled display noise signals are negative samples after block 1206 (see negative phase samples 808 in FIG. 8). In one embodiment, the sampling polarity of the display noise is reversed by skipping the sampling of the display noise (and skipping the excitation event) for one or more display line refresh periods. For example, the sampling of the display noise is skipped once during a display line refresh period that is located approximately in the middle of a display frame refresh period. This allows the display noise samples sampled during the first half of the display frame refresh period substantially cancel the display noise samples sampled during the last half of the display frame refresh period. Other embodiments can skip the noise sample at a different time or location within the display frame refresh period.

And in other embodiments, multiple samples can be skipped within a display frame refresh period. The locations of the line refresh periods in which the samples are obtained can be predetermined in some embodiments, while in other embodiments the locations of the line refresh periods can be randomized. When randomized, the location of the skips can be randomized for each display frame refresh period or every N display frame refresh periods, when N is an integer greater than one. Skipping multiple samples can be suited for embodiments that experience some variation in the amount of noise between the top and bottom of the display. For example, when the refresh events for the pixels at the top of the display are noisier than the refresh events for the pixels at the bottom of the display, and there is a slowly varying gradient between the top and the bottom refresh events, having three equally spaced skips along the scan may more effectively cancel the display noise. Additionally, multiple skips can make the process more robust to changes in the display patterns that occur at different locations within the display.

The method shown in FIG. 12 results in display noise samples switching between positive and negative samples. The positive (or negative) noise samples that were sampled prior to the skip cancel or substantially cancel the negative (or positive) noise samples that are sampled after the skip. In some embodiments, the display noise signal can change spatially from one end of the display to the other end due to different RC time constants in different regions of the display. These noise signal changes can appear as changes in the noise characteristic from the beginning of a frame to the end of the frame, which can result in the noise not canceling completely from the sense signals sensed during the frame refresh period.

Frame Averaging and Sample Phase Inversion

Another technique for reducing display noise in the sense signals of a force sensing device is to average the noise and force signal samples over several display frame refresh periods. Essentially, the number of positive display noise signal samples substantially equal the number of negative display noise signal samples over two or more display frame refresh periods.

Figure 13A:
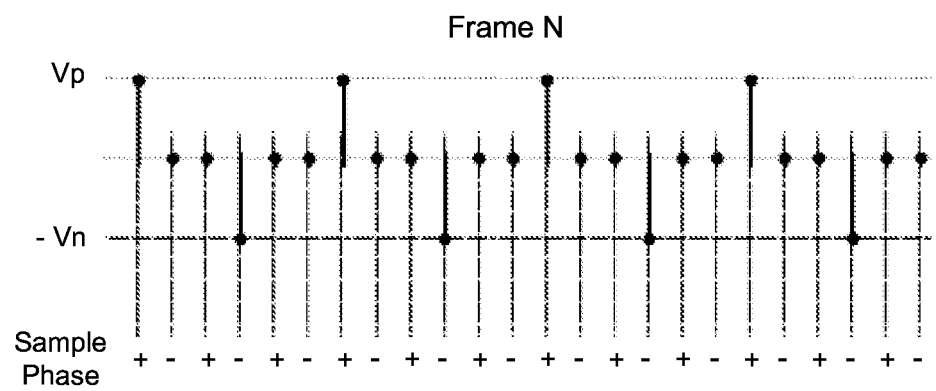
FIGS. 13A-13B are example noise samples and sampling phases with an odd periodicity display image.
Figure 13B:
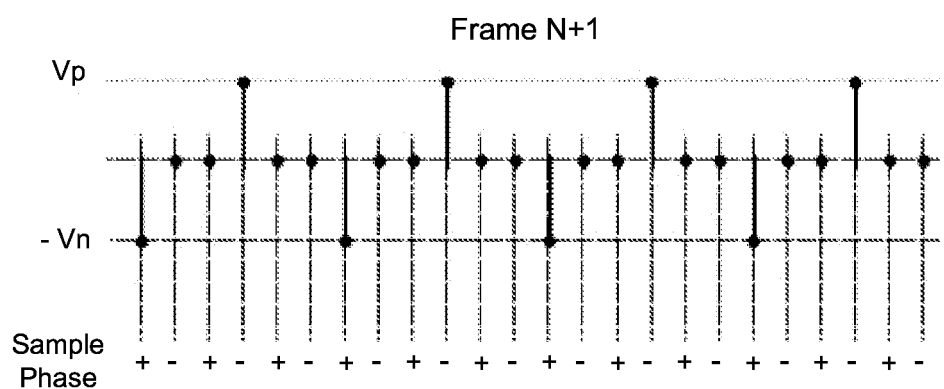

FIGS. 13A-13B are example noise samples and sampling phases with an odd periodicity display image. As described earlier, noise can have an odd periodicity over time when an odd number of pixels are arranged in a repeating pattern along the column lines of an LCD display (e.g., FIG. 6). FIGS. 13A-13B simplify the waveform shown in FIG. 8 to show only the display noise signal samples and sampling phases. FIG. 13A illustrates one frame refresh period, frame refresh period N, while FIG. 13B depicts frame refresh period N+1. After averaging the samples in frame refresh period N, the overall display noise sample is $K(Vp+Vn)$, where K represents a proportionality constant. The value of K depends on the periodicity and the implementation of the entire signal path.

After averaging the samples in frame refresh period N+1, the overall display noise sample is $(-K(Vp+Vn))$. Note that alternate or consecutive frame refresh periods have opposite sample phase polarities (positive or negative) due to display inversion. So when two consecutive frame refresh periods are averaged together, the display noise is cancelled or substantially cancelled due to the opposite polarities of the samples.

Figure 14A:
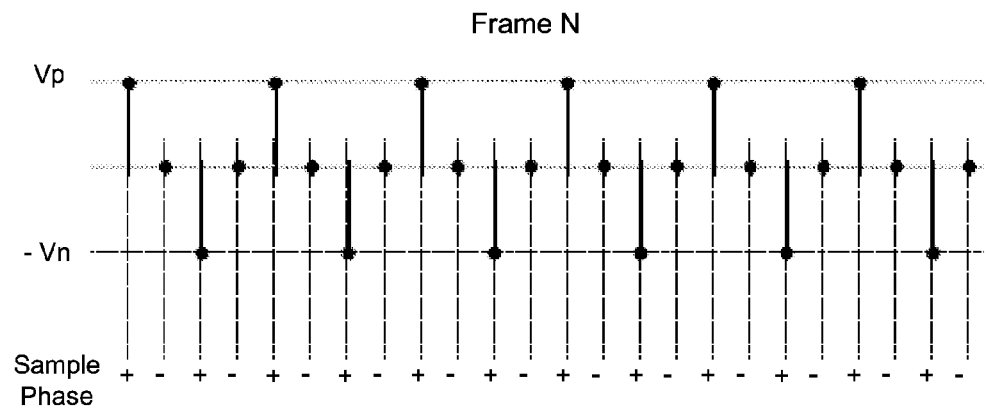
FIGS. 14A-14B are example noise samples and sampling phases with an even periodicity display image.
Figure 14B:
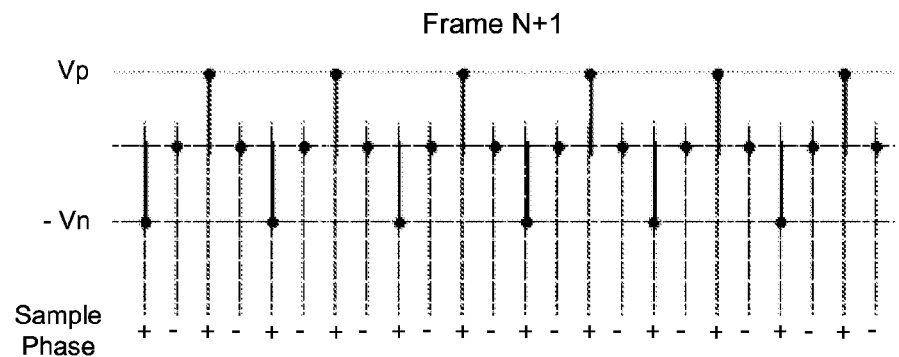

Unfortunately, in some embodiments, the display noise may not cancel out when the display noise has an even periodicity (e.g., FIG. 7). FIGS. 14A-14B are example noise samples and sampling phases with an even periodicity display image. FIG. 14A illustrates one frame refresh period, frame refresh period N, while FIG. 14B depicts frame refresh period N+1. After averaging the samples in frame refresh period N, the overall display noise sample is $A(Vp-Vn)$, where A represents a proportionality constant. Like K, the the value of A depends on the periodicity and the implementation of the entire signal path. After averaging the samples in frame refresh period N+1, the overall display noise sample is $A(Vp-Vn)$. Thus, the overall display noise samples for two consecutive frame refresh periods are additive because the display noise is sampled in the same phase (e.g., positive phase). So despite display inversion, averaging two consecutive frame refresh periods does not cancel the display noise when the display noise has an even periodicity.

Figure 15A:
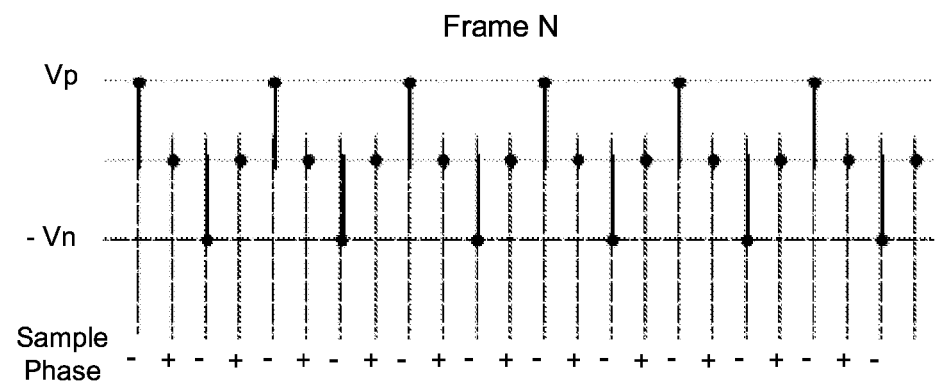
FIGS. 15A-15B are example noise samples and sampling phases with an even periodicity display image and inverted sampling phases.
Figure 15B:
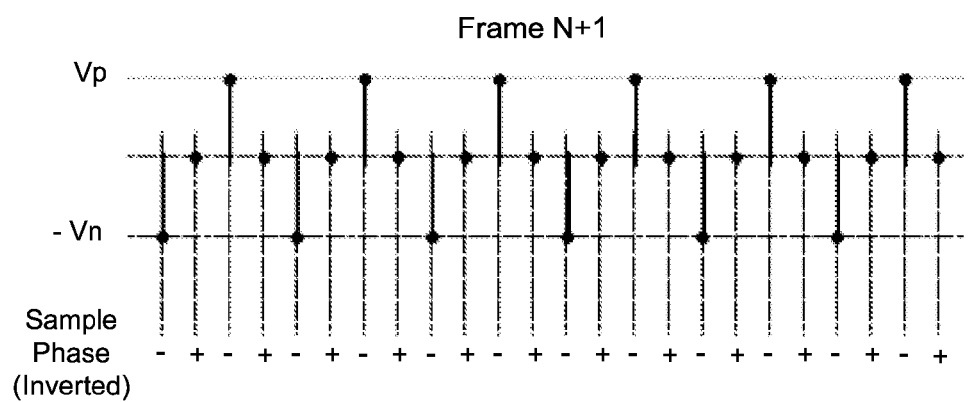

One method for cancelling the display noise with even periodicity is to invert the starting of the excitation signal, and thereby the sampling phase of the display noise to produce alternate frames having opposite display noise components in the output (positive and negative). FIGS. 15A-15B are example noise samples and sampling phases with an even periodicity display image and inverted sampling phases. FIG. 15A illustrates frame refresh period N while FIG. 15B depicts frame refresh period N+1. After averaging the samples in frame refresh period N, the overall display noise sample is $A(Vp-Vn)$. After averaging the samples in frame N+1, the overall display noise sample is $(-A(Vp-Vn))$. Thus, the overall display noise samples having opposite sample phase polarities are obtained by inverting the phase of the samples in one of two consecutive frame refresh periods. Now the display noise is cancelled due to the opposite polarities of the samples when the two consecutive frames are averaged together.

Thus, when the display noise has an odd periodicity, the display inversion scheme automatically averages out the display noise contributions. But when the display noise has an even periodicity, the phase of the sampling is switched to create an inversion between two consecutive frame refresh periods.

Figures 16, 17:
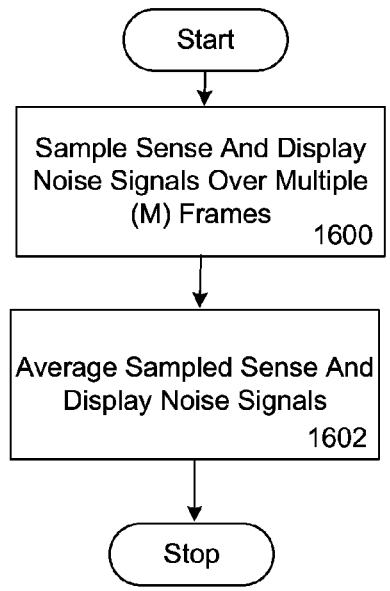
FIG. 16 is a flowchart of an example method for frame averaging that reduces both even and odd periodicities.
FIG. 17 is a table of an example four frame averaging scheme that reduces both even and odd periodicities.

In some embodiments, it can be difficult to determine when to invert the sampling phase. FIG. 16 is a flowchart of an example method for frame averaging that reduces both even and odd periodicities. Frame averaging can be used to cancel noise having both odd periodicity and even periodicity. Sense and display noise signals are sampled over multiple (M) frame refresh periods such that the samples have both positive and negative sample phases, as shown in block 1600. For example, the sense and display noise signals can be sampled over 4M frame refresh periods, where M is an integer equal to or greater than 1. For example, when M=1, the display noise and sense signals are sampled over four frames.

Next, as shown in block 1602, the sampled display noise and sense signals are averaged together. In one embodiment, after averaging four frame refresh periods, both odd periodicity and even periodicity display noise add to zero. FIG. 17 is a table of an example four frame averaging scheme that reduces both even and odd periodicities. The sample phase for each frame refresh period is shown in row 1700. Thus, frame refresh periods 1 and 2 have positive sample phases while frames 3 and 4 have negative sample phases. Four frames are averaged together in the illustrated embodiment because two of the averaged samples have a positive value while the other two averaged samples have a negative value so the display noise sums to zero over the four frames.

Row 1702 depicts the overall noise samples in each frame refresh period when the display noise has an odd periodicity. As shown, the overall noise samples in frames 1 and 4 have a positive polarity, while the overall noise samples in frames 2 and 3 have a negative polarity. Note that the samples in frames 1 and 2 sum to zero, and the samples in frames 3 and 4 sum to zero. Thus, averaging the four frames together substantially cancels the display noise.

Row 1704 shows the overall noise samples in each frame when the display noise has an even periodicity. The overall noise samples in frame refresh periods 1 and 2 have a positive polarity, while the overall noise samples in frames 3 and 4 have a negative polarity. Note that the samples in frames 1 and 2 together sum the display noise, and the samples in frames 3 and 4 together sum the display noise. But the sum of frames 1+2 cancels out the sum of frames 3+4. Thus, averaging the four frames together substantially cancels the display noise.

Most periodic display patterns can be expressed as a sum of odd and even noises. Consequently, the noises can be canceled or substantially cancelled by averaging multiple frames together.

In one embodiment, each set of four frames can be averaged together. Thus, frame refresh periods 1-4 can be averaged together, frame refresh periods 5-8 averaged together, frame refresh periods 9-12 averaged together, and so on. In another embodiment, a rolling four frame scheme can be used where the four frame refresh periods are determined after each frame. Thus, frames 1-4 can be averaged together, frames 2-5 averaged together, frames 3-6 averaged together, and so on.

Frame averaging and sample phase inversion can trade off latency and response time to sudden changes in input (e.g., force input), for precise measurement with latency. Not only can frame averaging and sample phase inversion average out the noise, it can cancel out relatively large predictable components caused by repeating display patterns. In some embodiments, the trade-off between latency and response time can be dynamically changed by switching between frame averaging and sample phase inversion and no frame averaging and sample phase inversion.

Various embodiments have been described in detail with particular reference to certain features thereof, but it will be understood that variations and modifications can be effected within the spirit and scope of the disclosure. For example, a device other than a touch sensing device and/or a force sensing device can share at least a portion of the display area. By way of example only, a fingerprint sensor can use at least a portion of the top surface of the display as an input region.

Even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

What is claimed is:

1. A display stack, comprising:
   a display layer;
   a sensing layer positioned below the display layer;
   a first filter associated with or positioned below the display layer; and
   a second filter positioned below the first filter and over the sensing layer, wherein
      a force sensing device includes the first filter and the sensing layer, and
      the first and second filters filter display noise produced by the display layer to reduce the display noise sampled by the force sensing device.

2. The display stack as in claim 1, further comprising:
   a front polarizer disposed over the display layer; and
   a back polarizer disposed below the display layer between the first and second filters.

3. The display stack as in claim 1, wherein
   the second filter comprises a conductive layer; and
   the first filter comprises a filtering layer disposed between the display layer and the second filter.

4. The display stack as in claim 3, further comprising a back light unit disposed below the conductive layer.

5. The display stack as in claim 4, wherein
   the sensing layer is disposed below the back light unit; and
   a compressible gap is defined between the back light unit and the sensing layer such that the sensing layer is spaced apart from the back light unit.

6. The display stack as in claim 5, wherein a capacitive force sensing device is formed with the conductive layer and the sensing layer.

7. The display stack as in claim 1, wherein the display layer comprises a liquid crystal display.

8. The display stack as in claim 7, wherein
   the second filter comprises a conductive layer; and
   the first filter comprises one or more VCOM buffers operably connected to the display layer, wherein at least one characteristic of at least one VCOM buffer is controlled to produce a low noise period.

9. The display stack as in claim 8, wherein the at least one characteristic of at least one VCOM buffer is adaptively controlled to produce a low noise period.

10. The display stack as in claim 5, wherein the sensing layer comprises a set of discrete electrodes.

11. An electronic device, comprising:
    a display layer;
    a first filter positioned below the display layer;
    a second filter positioned below the first filter; and
    a sensing layer positioned below the second filter, wherein
       a force sensing device includes the second filter and the sensing layer, and
       the first and second filters filter display noise produced by the display layer to reduce the display noise sampled by the force sensing device.

12. The electronic device as in claim 11, further comprising a cover layer positioned over the display layer, at least a portion of the cover layer acting as an input region for the force sensing device.

13. The electronic device as in claim 12, further comprising:
    a front polarizer disposed between the cover layer and the display layer; and
    a back polarizer disposed below the display layer between the first and second filters.

14. The electronic device as in claim 13, wherein
    the first filter comprises a first conductive layer positioned between the display layer and the back polarizer; and
    the second filter comprises a second conductive layer positioned below the back polarizer.

15. The electronic device as in claim 14, further comprising a back light unit disposed below the second conductive layer.

16. The electronic device as in claim 15, wherein
    the sensing layer is disposed below the back light unit; and
    a compressible gap is defined between the back light unit and the sensing layer such that the sensing layer is spaced apart from the back light unit.

17. The electronic device as in claim 11, wherein the sensing layer comprises a set of discrete electrodes and the second filter layer comprises a conductive layer.

18. The electronic device as in claim 11, wherein the sensing layer comprises a conductive layer and the second filter layer comprises a set of discrete electrodes.

19. The electronic device as in claim 11, wherein the force sensing device comprises a capacitive force sensing device.

20. The electronic device as in claim 11, wherein
- the first filter comprises a first conductive layer positioned between the display layer and a back light unit, and
- the second filter comprises a second conductive layer positioned below the back light unit.

\* \* \* \* \*